United States Patent [19]
Miyamoto

[11] Patent Number: 5,840,628
[45] Date of Patent: Nov. 24, 1998

[54] PLASMA CVD METHOD FOR DEPOSITING TIN LAYER

[75] Inventor: Takaaki Miyamoto, Kanagawa, Japan

[73] Assignee: Sony Corporation, Japan

[21] Appl. No.: 489,765

[22] Filed: Jun. 13, 1995

[30] Foreign Application Priority Data

Jun. 22, 1994 [JP] Japan ................................. 6-139765

[51] Int. Cl.⁶ ............................................ H01L 21/44
[52] U.S. Cl. ......................................... 438/680; 438/683
[58] Field of Search .................................. 437/241, 235; 438/643, 644, 680, 681, 683, 685

[56] References Cited

U.S. PATENT DOCUMENTS

| | | | |
|---|---|---|---|
| 5,246,881 | 9/1993 | Sandhu et al. | 437/192 |
| 5,508,066 | 4/1996 | Akahori | 427/571 |
| 5,545,574 | 8/1996 | Chen et al. | 437/40 |
| 5,567,243 | 10/1996 | Foster et al. | 118/730 |

FOREIGN PATENT DOCUMENTS 1-287920  11/1989  Japan .

*Primary Examiner*—Chandra Chaudhari
*Assistant Examiner*—Reneé R. Berry
*Attorney, Agent, or Firm*—Ronald P. Kananen

[57] ABSTRACT

A two-step plasma CVD method is adopted whereby a first TiN layer is deposited in a first plasma CVD process having a low $TiCl_4$ partial pressure and, subsequently, a second TiN layer is deposited in a second plasma CVD process having a high $TiCl_4$ partial pressure. By depositing a TiN bimetal layer with excellent step coverage, the amount of chlorine, which is piled up with ease on a boundary surface interfacing with a lower Ti layer, can be reduced, preventing after-corrosion of an Al-based metal layer. On top of that, the small amount of chlorine allows the contact resistance to be reduced.

21 Claims, 6 Drawing Sheets

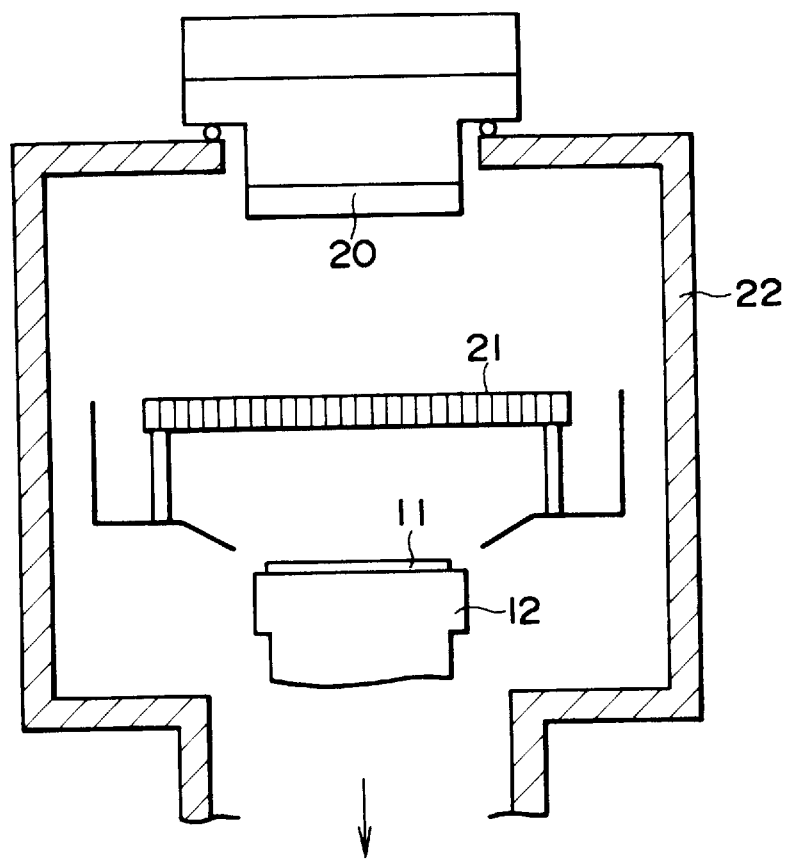
FIG. I
RELATED ART

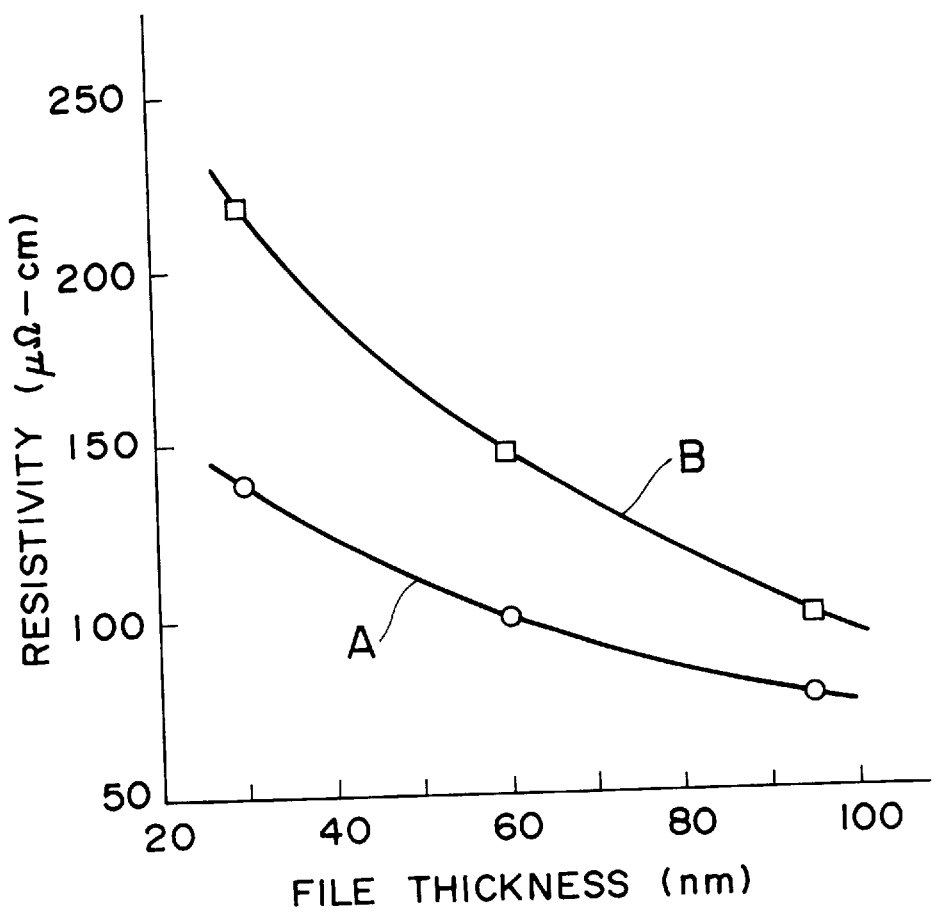

PLASMA CVD METHOD FOR DEPOSITING TiN LAYER

BACKGROUND OF THE INVENTION

1. Field of the Invention

The present invention in general relates to a plasma CVD method used in manufacturing processes of semiconductor devices and more particularly to a plasma CVD method for depositing nitrogen titanium (TiN) layers with a small quantity of residual impurity and step coverage excellence.

2. Description of Related Art

The design rule of semiconductor devices such as LSIs undergoes miniaturization from a half micron level to a quarter micron level or even lower. In addition, with the popular use of multilayer interconnection structures, the aspect ratio of the contact hole for connecting interconnection layers also reveals an increasing trend as well. For example, in a semiconductor abiding by the 0.18 $\mu$m rule, the thickness of an interlayer insulating film is about 1.0 $\mu$m for an opening diameter of a contact hole, 0.2 $\mu$m. Thus, the aspect ratio reaches 5. In order to achieve a multilayer interconnection structure having high reliability by means of a fine contact hole with a high aspect ratio, a technique is adopted whereby a Ti layer for ohmic contact and a TiN bimetal layer for preventing the interconnection material from being diffused are first deposited conformally inside the contact hole and then the contact hole is filled up with an upper-layer interconnection material or a contact plug by high-temperature sputtering of an Al-based metal or the blanket CVD or the select CVD of W.

Normally, in order to deposit a Ti or TiN layer, reactive sputtering and sputtering with the Ti metal used as a target material are carried out. In particular, collimated sputtering with an enhanced vertical incident component of sputtering particles attracts attention. Even with this method which has excellent step coverage, it is difficult to deposit a film conformally inside a fine contact hole attaining an aspect ratio of 5. This problem is explained by referring to FIGS. 1 and 2A to 2D.

FIG. 1 shows a sketchy sectional view of a typical configuration of a collimated sputtering apparatus. As shown in the figure, a target 20 made of a Ti metal material is placed, facing a substrate 11 to be processed which is mounted on a substrate stage 12. A gas such as Ar and $N_2$ is introduced from a gas introducing hole not shown in the figure. After the inside of a sputtering chamber 22 has been put in a predetermined reduced pressure atmosphere, an RF power is applied between the processed substrate 11 and the target 20. Ti sputtered from the target 20 passes through a collimator 21 installed between the processed substrate 11 and the target 20 and is deposited on the processed substrate 11 as the Ti metal as it is or as TiN resulting from a chemical reaction with $N_2$. The collimator 21 is a porous board having a structure comprising a number of through holes each etched at a high opening factor in a direction perpendicular to the surface of the processed substrate 11. The collimator 21 is made up of a member such as ceramic or a metal which increases the vertical incident particle component to the substrate 11. It should be noted that components of the collimator 21 such as a vacuum pump and a substrate heating mechanism are not shown in the figure.

Processes for depositing Ti and TiN layers on the processed substrate with a contact hole to be formed thereon by means of the collimated sputtering apparatus are explained by referring to FIGS. 2A to 2D. First of all, an interlayer insulating film 2 is deposited on a semiconductor substrate 1 made of a material such as Si. The interlayer insulating film 2 is made of a material such as $SiO_2$ and has a thickness of 1 $\mu$m. The semiconductor substrate 1 has active components created thereon. An example of the active components is an impurity diffusion layer not shown in the figure. After the deposition of the interlayer insulating film 2, a contact hole 3 having a diameter of 0.2 $\mu$m is etched through a location facing the impurity diffusion layer (refer to FIG. 2A). Then, the processed substrate 1 is mounted on a substrate stage 11 which has been heated to 200° C. A Ti layer 4 having a thickness of 10 nm is deposited on the semiconductor substrate 1 under the following sputtering conditions: an Ar flow rate of 25 sccm, a chamber pressure of 0.2 Pa and an RF power of 8 kW. A state with the Ti layer 4 deposited on the semiconductor substrate 1 is shown in FIG. 2B. Subsequently, a TiN layer 5 with a thickness of 20 nm is deposited under the same sputtering conditions introduced above except that $N_2$ is added at a flow rate of 25 sccm. At that time, as shown in FIG. 2C, the TiN layer 5 is deposited on the top portion of the contact hole 3, forming an overhung shape, while the TiN layer 5 is deposited on the circumference of the bottom of the contact hole 3, forming a thin layer. If an Al-based metal layer 6 is deposited in this state by, for example, high-temperature sputtering, a void 7 is resulted in as shown in FIG. 2D, giving rise to a reliability problem of a contact plug. The void 7 is generated as well even if the CVD of W is adopted in place of the sputtering of the Al-based metal layer.

In order to solve step coverage problems encountered in these sputtering methods including the collimation technique, a plasma CVD method using $TiCl_4$ is adopted. The plasma CVD method is disclosed in, among other reports, a collection of theses presented in the 44th symposium on semiconductors and integrated circuits held in 1993, page 31. With this method in which $TiCl_4$ is used as a Ti source gas, a TiN layer can be deposited sequentially right after the deposition of a Ti layer by $H_2$ reduction of $TiCl_4$ and by further adding $N_2$ to the above gas.

In order to form a TiN layer with good step coverage even by the plasma CVD, it is necessary to deposit a TiN film under the surface reaction kinetics which are not limited by the supply of $TiCl_4$. For this reason, a sufficient amount of $TiCl_4$ must be supplied for $N_2$ and $H_2$. If the supply of $TiCl_4$ is not adequate, a sufficient quantity of $TiCl_4$ can not reach the bottom of a contact hole with a high aspect ratio. In this case, it is very likely that the chemical reaction proceeds only at locations in close proximity to the entrance of the contact hole.

In this method which attaches importance to the step coverage, however, a large flow of $TiCl_4$, a Cl-based gas, is used. Accordingly, a large quantity of chlorine tends to be left as residue in the TiN layer. In particular, since the residual chlorine on the boundary surface with the lower-layer Ti film has a high concentration, the contact resistance also increases as well. In addition, since the residual chlorine gradually diffuses, using an Al-based metal as upper-layer interconnection will give rise to the device's degraded-reliability problem due to generation of after-corrosion. The use of an Al-based metal as lower-layer interconnection will also cause similar after-corrosion to be generated in the lower layer when a TiN layer is deposited inside a ware hole formed in close proximity to the lower layer.

If an organic Ti compound is used as a source gas in the same CVD, no after-corrosion problem is encountered. None the less, the fact that it is difficult to deposit a Ti layer and the fact that CVD conditions satisfying both a reduced amount of carbon residue and good step coverage can not be found are the present state of the art.

OBJECTS AND SUMMARY OF THE INVENTION

It is a first object of the present invention to present a plasma CVD method that can be used for depositing a TiN layer having good step coverage and low concentration of residual impurities such as chlorine and carbon on a processed substrate having a fine hole with a high aspect ratio formed thereon.

It is a second object of the present invention to present a plasma CVD method for TiN layers that can be used for manufacturing a semiconductor device having a low contact resistance, no risk of after-corrosion of Al-based metal interconnection and excellent reliability.

Plasma CVD methods provided by the present invention are proposed to solve the problems described above. One of the plasma CVD methods for depositing a TiN layer on a processed substrate using a mixture gas comprising a Ti-based gas and $H_2$ and nitrogen gases is a two-step plasma CVD method comprising a first plasma CVD process with a low mixture ratio of the Ti-based gas in the mixture gas and a second plasma CVD process with a high mixture ratio of the Ti-based gas in the mixture gas wherein the first plasma CVD process is carried out prior to the second plasma CVD process.

Another plasma CVD method for depositing a TiN layer on a processed substrate using a mixture gas comprising a Ti-based gas and $H_2$ and nitrogen gases is a two-step plasma CVD method comprising a first plasma CVD process with a high mixture ratio of $H_2$ in the mixture gas and a second plasma CVD process with a low mixture ratio of $H_2$ in the mixture gas wherein the first plasma CVD process is carried out prior to the second plasma CVD process.

A still further plasma CVD method for depositing a TiN layer on a processed substrate using a mixture gas comprising a Ti-based gas and $H_2$ and nitrogen gases is a two-step plasma CVD method comprising a first plasma CVD process with low mixture ratios of the Ti-based gas and $H_2$ in the mixture gas and a second plasma CVD process with high mixture ratios of the Ti-based gas and $H_2$ in the mixture gas wherein the first plasma CVD process is carried out prior to the second plasma CVD process.

It should be noted that the phrases low and high mixture ratios used in the above description are not absolute values of mixture ratios or gas flows. Instead, they are relative values indicating comparison of a mixture ratio used in one process to that used in the other process of the two-step sputtering.

Examples of the Ti-based gas used in the present invention are halogen titanium such as $TiCl_4$ (mp=−25° C. and bp=136° C.), $TiBr_4$ (mp=39° C. and bp=230° C.) and $TiF_4$ (which sublimates at 284° C.) in addition to organic Ti compounds such as tetradimethylaminotitanium with the chemical symbol $Ti(N(CH_3)_2)_4$ and tetradiethylaminotitanium with the chemical symbol $Ti(N(C_2H_5)_2)_4$. $TiCl_4$ is a Ti-based gas which is in a liquid state at room temperature. Therefore, $TiCl_4$ is easy to handle, making it desirable to use this Ti-based gas. These halogen titanium gases and the organic Ti compounds can be introduced to a plasma CVD chamber by the widely known burning technique or a thermal bubbling technique which makes use of a carrier gas.

A nitrogen-based gas used in the present invention is a gas such as $N_2$, $NH_3$ and $N_2H_4$ which gas includes N atoms and can become a nitride agent.

A unique feature offered by the present invention is that the plasma CVD process of the TiN layer is split into two steps. In the first plasma CVD process at the earlier step, a film is deposited under a condition of providing a low concentration of a residual impurity such as chlorine and carbon. In the second plasma CVD process at the later step, on the other hand, a film is deposited under a condition of providing good step coverage.

In order to implement the two-step plasma CVD, in the first plasma CVD process, the mixture ratio of the Ti-based gas in the raw mixture gas is made low or the mixture ratio of $H_2$, a reductant gas, is set at a high value. Under this condition, the Ti-based gas is reduced sufficiently, allowing a TiN layer having a high purity to be deposited without the pileup of impurities such as chlorine and carbon on the boundary surface.

In the subsequent second plasma CVD process, on the contrary, the mixture ratio of the Ti-based gas in the raw mixture gas is made high or the mixture ratio of $H_2$, a reductant gas, is set at a low value. Under this condition, the Ti-based gas is supplied sufficiently. Accordingly, a surface reaction occurs at a limited rate, improving step coverage.

In the first plasma CVD process, the earlier one of the two processes, the flow rate of the Ti-based gas is small in comparison with that of $H_2$, approaching the state of a bottleneck in the supply of the Ti-based gas. As a result, there is the possibility of the TiN-layer step coverage's declining to a certain degree. For this reason, in the plasma CVD method according to claim 3, the flow rates of the Ti-based gas as well as $H_2$ are reduced to give the same mixture ratio as that of the conditions which result in good step coverage. The Ti-based gas is thereby sufficiently reduced at a slightly lower deposition rate, making it possible to suppress the pileup of impurities on the boundary surface at the early stage of the growth while sustaining good step coverage.

BRIEF DESCRIPTION OF THE DRAWINGS

FIG. 1 is a sketchy sectional view showing a typical configuration of a collimated sputtering apparatus used for explaining the conventional sputtering method;

FIG. 2A shows the state of a contact hole etched through an interlayer insulating film on a semiconductor substrate;

FIG. 2B shows the state of a deposited Ti layer;

FIG. 2C shows the state of a deposited TiN layer; and

FIG. 2D shows the state of a deposited Al-based metal layer;

FIG. 4A shows the state of a contact hole etched through an interlayer insulating film on a semiconductor substrate;

FIG. 4B shows the state of a deposited Ti layer;

FIG. 4C shows the state of a deposited first TiN layer;

FIG. 4D shows the state of a deposited second TiN layer; and

FIG. 4E shows the state of a deposited Al-based metal layer;

FIG. 5 shows curves A and B representing relations between the resistance value and the thickness of TiN layer for the method provided by the present invention and the conventional method respectively.

DETAILED DESCRIPTION OF THE PREFERRED EMBODIMENTS

Figure 2A:
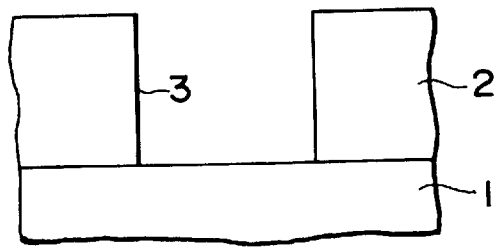
FIGS. 2A to 2D are sketchy sectional views used for explaining problems with the conventional sputtering method and a process order thereof.
Figure 2B:
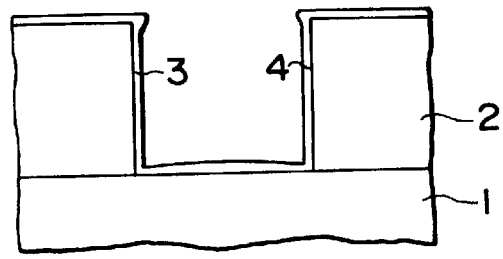
Figure 2C:
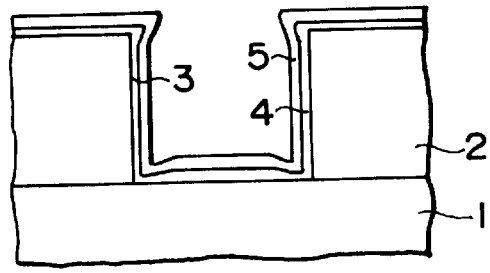
Figure 2D:
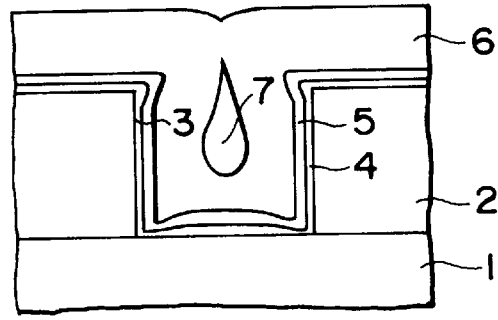
Figure 3:
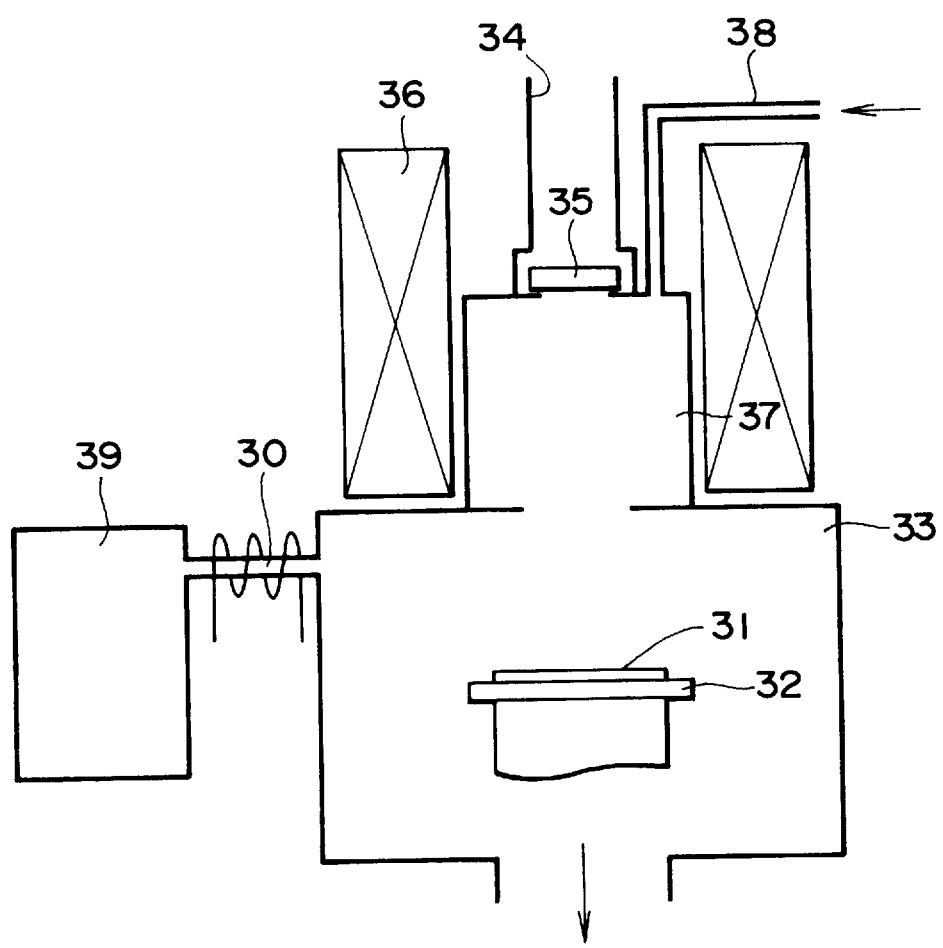
FIG. 3 is a sketchy sectional view showing a typical configuration of an ECR plasma CVD apparatus employed in embodiments provided by the present invention.

The present invention will become apparent from the following detailed description of preferred embodiments with reference to accompanying diagrams. First of all, a typical configuration of an ECR (Electron Cyclotron Resonance) plasma CVD apparatus employed as an apparatus common to all the embodiments is explained by referring to FIG. 3. A microwave with a frequency of 2.45 GHz is introduced to a plasma generating chamber 37 through a quartz window 35 by means of a waveguide 34. As shown in the figure, the plasma generating chamber 37 has an opening interfacing with a plasma CVD chamber 33 having a substrate stage 32 installed therein for mounting a substrate 31 to be processed by a plasma CVD method. Reference numeral 36 is a magnet for generating a magnetic field of 0.0875 T in t he plasma generating chamber 37. In the magnetic field, an ECR plasma is generated. Gases such as $N_2$, $H_2$ and Ar are introduced to the plasma generating chamber 37 through a gas pip e 38. On the other hand, $TiCl_4$ is supplied directly to the plasma reaction chamber 33 from a specially provided burning apparatus 39 through a thermal gas pipe 30. It should be noted that small components such as a substrate stage heating mechanism and a vacuum pump are not shown in the figure.

Next, the first embodiment provided by the present invention is explained.

In this embodiment, a plasma CVD method is applied wherein the mixture ratio of $TiCl_4$ is set at a low value at an early stage of the growth of a TiN layer and, later on, the mixture ratio is in creased. This technique is explained by referring to FIGS. 4A to 4E. For the sake of convenience in the explanation, material layers and a contact hole are shown in the figures with dimensions and other attributes differing from those of the real ones.

Figure 4A:
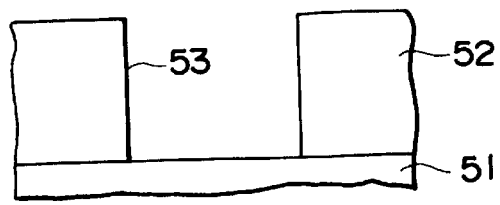
FIGS. 4A to 4E are sketchy sectional views showing first, second and third embodiments and their process orders provided by the present invention.

First of all, an interlayer insulating film 52 made of $SiO_2$ with a thickness of 1 μm is deposited by a reduced pressure CVD technique using TEOS on a semiconductor substrate 51 made of a material such as Si as shown in FIG. 4A. A contact hole 53 facing a diffusion layer of the semiconductor substrate 51 is then etched. It should be noted that the diffusion layer itself is not shown in the figure. The contact hole 53 has an opening diameter ranging from 0.15 to 0.25 μm. In this embodiment, the contact hole has an opening diameter of 0.2 μm.

Figure 4B:
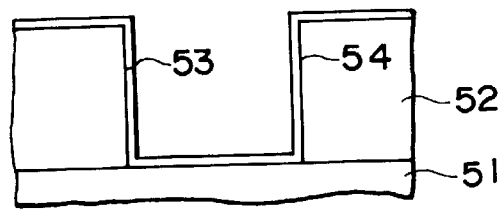

Next, a naturally oxidized film on the diffusion layer exposed to the bottom of the contact hole 53 is removed by thin HF water solution abluent. Subsequently, a Ti layer 54 is deposited by means of the ECR plasma CVD apparatus as shown in FIG. 4B under the following conditions:

| | |
|---|---|
| $TiCl_4$ | 3 sccm |
| $H_2$ | 100 sccm |
| Gas pressure | 0.3 Pa |
| Microwave power | 2.8 to 2.9 Kw (at 2.45 GHz) |
| Substrate stage temperature | 380° C. to 460° C. |

The thickness of the Ti layer 54 is in the range 2 to 30 nm. In this embodiment, a Ti layer 54 having a thickness of 10 nm is deposited. It should be noted that the Ti layer 54 can also be deposited by using the conventional collimated sputtering technique as usual.

Figure 4C:
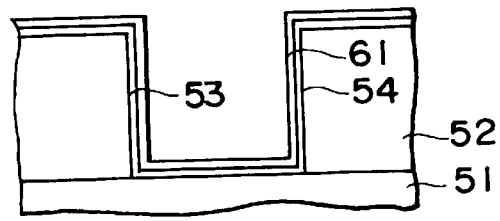

TiN layers are deposited by using the two-step plasma CVD method. First of all, a first TiN layer 61 is deposited as shown in FIG. 4C in a first plasma CVD process described below, wherein the mixture ratio of $TiCl_4$ is made low, under the following conditions:

| | |
|---|---|
| $TiCl_4$ | 3 to 10 sccm |
| $N_2$ | 8 sccm |
| $H_2$ | 13 to 100 sccm |
| Gas pressure | 0.13 Pa |
| Microwave power | 2.8 to 2.9 Kw (at 2.45 GHz) |
| Substrate stage temperature | 380° C. to 460° C. |

The thickness of the first TiN layer 61 on the interlayer insulating film 52 is typically 20 nm. In this first plasma CVD process, the flow rate of $TiCl_4$ is small, allowing the $TiCl_4$ to be reduced sufficiently by high-density hydrogen plasma dissociated by ECR plasma in spite of the fact that the substrate temperature is set at a relatively low value in the range 380° C. to 460° C. As a result, a highly pure TiN layer is deposited without chlorine pileup on the boundary surface interfacing with the lower Ti layer.

Figure 4D:
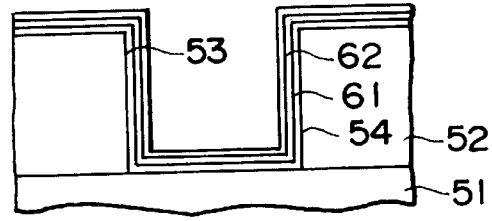
Figure 4E:
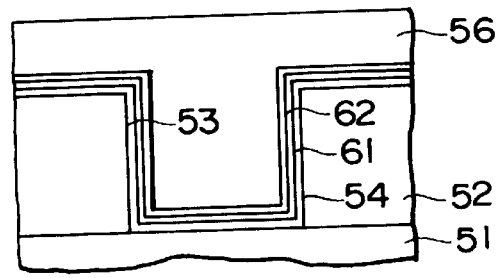

Subsequently, a second TiN layer 62 is deposited as shown in FIG. 4D in a second plasma CVD process with an increased mixture ratio of $TiCl_4$ which plasma CVD process is carried out under the following conditions:

| | |
|---|---|
| $TiCl_4$ | 20 sccm |
| $N_2$ | 8 sccm |
| $H_2$ | 26 sccm |
| Gas pressure | 0.13 Pa |
| Microwave power | 2.8 to 2.9 Kw (at 2.45 GHz) |
| Substrate stage temperature | 380° C. to 460° C. |

The thickness of the second TiN layer 62 on the bottom of the contact hole 53 is typically 20 nm. In this second plasma CVD process, the supply of $TiCl_4$ is adequate, causing a surface reaction to occur at a limited rate. As a result, the second TiN layer 62 is deposited with good step coverage. Since the flow rate of $H_2$ is not changed, the mixture ratio of $H_2$ is decreased. However, since the second plasma CVD process is a continuation of the first plasma CVD, the generation of plasma is very stable. Accordingly, $TiCl_4$ is sufficiently reduced, allowing a TiN layer containing a small amount of chlorine to be deposited. In addition, being a continuation of the first plasma CVD process, the second plasma CVD process also raises the surface temperature of the substrate being processed to a value higher than that of the first plasma CVD process due to radiant heat of the plasma. The increased surface temperature of the substrate being processed also contributes to the reduction of $TiCl_4$ and reduction in chlorine content.

Next, an Al-based metal layer 56 is deposited by high-temperature sputtering, a widely known technique for filling up the contact hole 53. Since the step coverage of the second TiN layer 62 is good and there is no formed overhung shape, the Al-based layer 56 fills up the contact hole 53 without generating a void. On top of that, the Al-based layer 56 is deposited to result in a flat surface.

In this embodiment, a TiN layer with a low chlorine content and good step coverage can be deposited by a two-step film deposition wherein the flow rate of $TiCl_4$ is lowered at the early stage of the plasma CVD.

A second embodiment provided by the present invention is described as follows.

In this second embodiment, a plasma CVD method is adopted wherein the mixture ratio of $H_2$ is raised at the early stage of the growth of a TiN layer and then lowered afterwards. This process is explained by referring again to FIGS. 4A to 4E.

Since the process up to the deposition of a Ti layer shown in FIG. 4A is the same as that of the first embodiment, the explanation is not repeated here. Subsequently, a TiN layer is deposited by the following two-step plasma CVD. First of all, a first TiN layer 61 shown in FIG. 4C is deposited under the following conditions including a high mixture ratio of $H_2$:

| | |
|---|---|
| $TiCl_4$ | 20 sccm |
| $N_2$ | 8 sccm |
| $H_2$ | 35 to 100 sccm |
| Gas pressure | 0.13 Pa |
| Microwave power | 2.8 to 2.9 Kw (at 2.45 GHz) |
| Substrate stage temperature | 380° C. to 460° C. |

The thickness of the first TiN layer 61 on the interlayer insulating film 52 is typically 20 nm. In this first plasma CVD process, the flow rate of $H_2$ is small, allowing $TiCl_4$ to be reduced sufficiently by high-density hydrogen plasma dissociated by ECR plasma in spite of the fact that the substrate temperature is set at a relatively low value of 410° C. As a result, a highly pure TiN layer is deposited without chlorine pileup on the boundary surface interfacing with the lower Ti layer.

Subsequently, a second TiN layer 62 is deposited as shown in FIG. 4D in a second plasma CVD process with a decreased mixture ratio of $H_2$ which plasma CVD process is carried out under the same conditions as those of the second plasma CVD process of the first embodiment listed again as follows:

| | |
|---|---|
| $TiCl_4$ | 20 sccm |
| $N_2$ | 8 sccm |
| $H_2$ | 26 sccm |
| Gas pressure | 0.13 Pa |
| Microwave power | 2.8 to 2.9 Kw (at 2.45 GHz) |
| Substrate stage temperature | 380° C. to 460° C. |

The thickness of the second TiN layer 62 on the bottom of the contact hole 53 is typically 30 nm. In this second plasma CVD process, the flow rate of $H_2$ is decreased, causing a surface reaction of $TiCl_4$ to occur at a limited rate. As a result, the second TiN layer 62 is deposited with good step coverage. In spite of the fact that the mixture ratio of $H_2$ is decreased, the second plasma CVD process is a continuation of the first plasma CVD, giving rise to very stable generation of plasma. Accordingly, $TiCl_4$ is sufficiently reduced, allowing a TiN layer containing a small amount of chlorine to be deposited. In addition, being a continuation of the first plasma CVD process, the second plasma CVD process also raises the surface temperature of the substrate being processed to a value higher than that of the first plasma CVD process due to radiant heat of the plasma. The increased surface temperature of the substrate being processed also contributes to the promotion of the reduction of $TiCl_4$ and reduction in chlorine content. Since the deposition of the Al-based metal layer 56 takes place in the same way as that in the first embodiment, its description is not repeated here.

In this embodiment, a TiN layer with a low chlorine content and good step coverage can be deposited by a two-step film deposition wherein the flow rate of $H_2$ is increased at the early stage of the plasma CVD.

By the way, a relation between the thickness and resistance value of a TiN layer formed in a two-step film deposition process by using the plasma CVD technique adopted in this embodiment is shown in FIG. 5. An A curve shown in the figure represents the relation for this embodiment wherein the flow rates of $H_2$ are fixed at 40 and 26 sccm in the first and second plasma CVD processes respectively. A B curve is a reference curve representing a relation between the thickness and resistance value of a TiN layer deposited by using a single-step plasma CVD technique in which the flow rate of $H_2$ is fixed at 26 sccm. The conditions of this single-step plasma CVD technique are the same as those of the second plasma CVD method adopted in this embodiment. The reference curve indicates that the resistance value is big due to chlorine pileup on the boundary surface. With this embodiment, however, the resistance can be decreased to several tens of percents of the reference value.

A third embodiment provided by the present invention is described as follows.

In this third embodiment, a plasma CVD method is adopted wherein the flow rates of $TiCl_4$ and $H_2$ are reduced at the early stage of the growth of a TiN layer and then increased afterwards. This process is explained by referring again to FIGS. 4A to 4E.

Since the process up to the deposition of a Ti layer shown in FIG. 4B is the same as that of the first embodiment, the explanation is not repeated here. Subsequently, a TiN layer is deposited by the following two-step plasma CVD. First of all, a first TiN layer 61 shown in FIG. 4C is deposited under the following conditions including small flow rates of $TiCl_4$ and $H_2$:

| | |
|---|---|
| $TiCl_4$ | 3 to 10 sccm |
| $N_2$ | 8 sccm |
| $H_2$ | 7 to 13 sccm |
| Gas pressure | 0.13 Pa |
| Microwave power | 2.8 to 2.9 Kw (at 2.45 GHz) |
| Substrate stage temperature | 380° C. to 460° C. |

The thickness of the first TiN layer 61 on the interlayer insulating film 52 is typically 20 nm. In this first plasma CVD process, the flow rates of both $TiCl_4$ and $H_2$ are small. On top of that, the mixture ratios are the same as the conditions for the second plasma CVD process which results in good step coverage. Accordingly, $TiCl_4$ is reduced sufficiently by high-density hydrogen plasma dissociated by ECR plasma in spite of the fact that the substrate temperature is set at a relatively low value of 410° C. As a result, a highly pure TiN layer is deposited without chlorine pileup on the boundary surface interfacing with the lower Ti layer.

Subsequently, a second TiN layer 62 is deposited as shown in FIG. 4D in a second plasma CVD process with decreased flow rates of both $TiCl_4$ and $H_2$ which plasma CVD process is carried out under the same conditions as those of the second plasma CVD process of the first embodiment listed again as follows:

| | |
|---|---|
| $TiCl_4$ | 20 sccm |
| $N_2$ | 8 sccm |

| | |
|---|---|
| H$_2$ | 26 sccm |
| Gas pressure | 0.13 Pa |
| Microwave power | 2.8 to 2.9 Kw (at 2.45 GHz) |
| Substrate stage temperature | 410° C. |

The thickness of the second TiN layer 62 on the bottom of the contact hole 53 is typically 30 nm. In this second plasma CVD process, a surface reaction of TiCl$_4$ to occurs at a limited rate much like the previous embodiment. As a result, the second TiN layer 62 is deposited with good step coverage. The second plasma CVD process is a continuation of the first plasma CVD wherein the flow rates of both TiCl$_4$ and H$_2$ are increased, giving rise to very stable generation of plasma. Accordingly, TiCl$_4$ is sufficiently reduced, allowing a TiN layer containing a small amount of chlorine to be deposited. In addition, being a continuation of the first plasma CVD process, the second plasma CVD process also raises the surface temperature of the substrate being processed to a value higher than that of the first plasma CVD process due to radiant heat of the plasma. The increased surface temperature of the substrate being processed also contributes to the promotion of the reduction of TiCl$_4$ and reduction in chlorine content. Since the deposition of the Al-based metal layer 56 takes place in the same way as that in the first embodiment, its description is not repeated here.

In this embodiment, a TiN layer with a low chlorine content and good step coverage can be deposited by two-step film deposition wherein the flow rates of both TiCl$_4$ and H$_2$ are increased at the early stage of the plasma CVD.

Figure 6A:
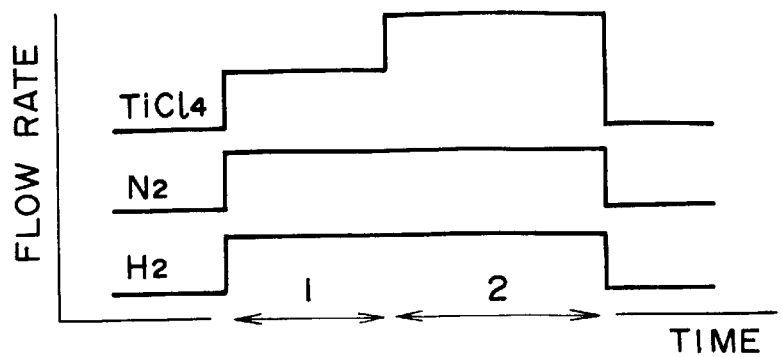
FIGS. 6A, 6B and 6C show charts representing gas flows in the plasma CVD methods as implemented by the first, second and third embodiments in accordance with the present invention.
Figure 6B:
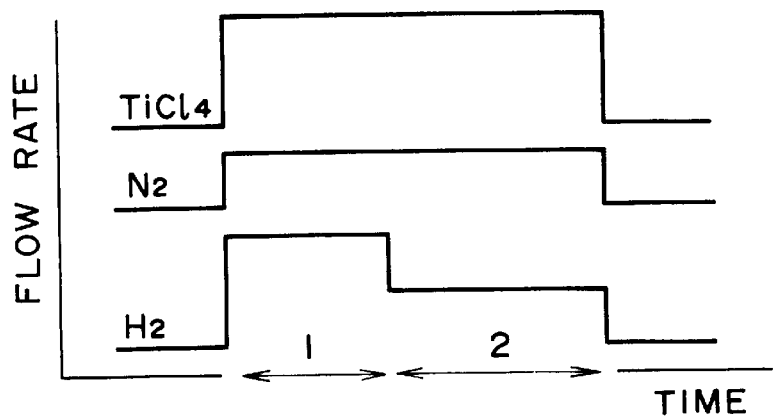
Figure 6C:
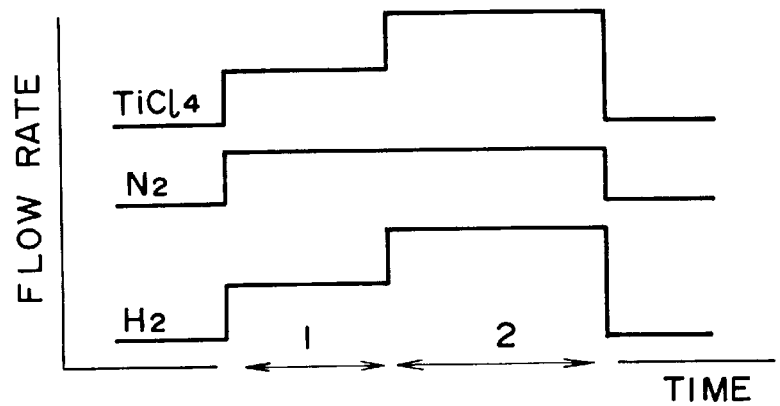

So far, three different embodiments implementing a two-step plasma CVD technique have been explained. In order to allow the reader to gain deeper understanding, charts representing gas flow rates of the embodiments are shown in FIGS. 6A to 6C. FIGS. 6A to 6C show charts representing gas flow rates for the first, second and third embodiments respectively. The first segment on the horizontal axis of each of the figures shows the flow rate of the first plasma CVD process whereas the second segment shows that of the second plasma CVD process. It should be noted that the horizontal and vertical axes of each of the figures represent arbitrary values of the time and flow rate respectively.

The scope of the present invention is not limited to the three preferred embodiments described above. A variety of changes can be made to the embodiments. For example, TiCl$_4$ is used in the embodiments as a Ti-based gas. It should be noted, however, that a variety of halogen titanium gases described earlier can also be used as well. In addition, by carrying out two-step plasma CVD using an organic titanium substance, the amount of residual carbon in the TiN layer can be reduced and the sheet resistance can be lowered.

Another example of the changes is the use of a substitute for N$_2$ in the embodiments as an N-based gas. That is to say, a gas having nitrogen atoms such as NH$_3$ and N$_2$H$_4$ can also be properly used as well. In addition, the sputtering yield can also be increased by doping the mixture gas with a thin gas such as Ar. Furthermore, an effect of the present invention can be displayed also in a case where an oxygen-based gas such as O$_2$ is used for doping and TiON is used as a bimetal layer.

In the embodiments, a two-step plasma CVD method is adopted wherein gas flow rates are changed once during the deposition of TiN layers. However, the technological concept provided by the present invention allows the gas flow rates to be changed at more than two steps. In addition, instead of changing the gas flow rates at several steps, the gas flow rates can be increased or decreased by smooth changes.

In the embodiments, an ECR plasma CVD apparatus is employed as a plasma CVD apparatus. It should be noted, however, that an apparatus of any type such as the parallel plate plasma CVD apparatus, the helicon wave plasma CVD apparatus, the ICP (Inductively Coupled Plasma) CVD apparatus and the TCP (Transformer Coupled Plasma) CVD apparatus can also be employed to result in the same effects as those of the present invention. In addition, an optical plasma CVD for radiating an exciting light beam such as a low-pressure Hg lamp and excimer laser can also be adopted in conjunction with the plasma.

It is obvious from the above description that, by carrying out two-step plasma CVD wherein mixture ratios of gases are changed in accordance with a plasma CVD method provided by the present invention, the amount of residual impurities such as chlorine and carbon in a TiN layer can be reduced, allowing a bimetal layer with good step coverage to be deposited.

On top of that, the plasma CVD method provided by the present invention allows a TiN layer having a small contact resistance and no possibility of after-corrosion of Al-based metal interconnection as well as a contact plug with excellent reliability to be deposited.

The effects of the present invention described above contribute much to the quality improvement of semiconductor devices and their manufacturing methods which devices have multilayer interconnection based on a fine design rule of the deep submicron class. As a result, the present invention has a significant value in industrial applications.

What is claimed is:

1. A plasma CVD method for depositing TiN layers on a processed substrate by using mixture gas comprising Ti-based gas, H$_2$ gas and nitrogen-based gas, said plasma CVD method wherein a first plasma CVD process with a low mixture ratio of said Ti-based gas in said mixture gas is carried out prior to a second plasma CVD process with an increased mixture ratio of said Ti-based gas in said mixture gas.

2. A plasma CVD method for depositing TiN layers on a processed substrate by using mixture gas comprising Ti-based gas, H$_2$ gas and nitrogen-based gas, said plasma CVD method wherein a first plasma CVD process with a high mixture ratio of said H$_2$ in said mixture gas is carried out prior to a second plasma CVD process with a decreased mixture ratio of said H$_2$ gas in said mixture gas.

3. A plasma CVD method for depositing TiN layers on a processed substrate by using mixture gas comprising Ti-based gas, H$_2$ gas and nitrogen-based gas, said plasma CVD method wherein a first plasma CVD process with low mixture ratios of said Ti-based gas and said H$_2$ gas in said mixture gas is carried out prior to a second plasma CVD process with increased mixture ratios of said Ti-based gas and said H$_2$ gas in said mixture gas.

4. A plasma CVD method according to claim 1, 2 or 3 wherein said Ti-based gas is either halogen titanium or an organic titanium compound.

5. A plasma CVD method according to claim 1, 2 or 3 wherein said nitrogen-based gas is either N$_2$, NH$_3$ or N$_2$H$_4$.

6. A plasma CVD method according to claim 1 wherein a relative ratio of said Ti-based gas mixture ratio in said first plasma CVD process to said Ti-based gas mixture ratio in said second plasma CVD process is 1/10 to 5/10.

7. A plasma CVD method according to claim 6 wherein a relative ratio of said H$_2$ gas in said first plasma CVD process to said H$_2$ gas in said second plasma CVD process is 1/2 to 8/2.

8. A plasma CVD method according to claim 7 wherein a ratio of said nitrogen-based gas is fixed in both said first and second plasma CVD processes.

9. A plasma CVD method according to claim 2 wherein a ratio of said $H_2$ gas in said first plasma CVD process to said $H_2$ gas in said second plasma CVD process is 17/13 to 50/13.

10. A plasma CVD method according to claim 9 wherein ratios of said Ti-based gas and said nitrogen-based gas are fixed in both said first and second plasma CVD processes.

11. A plasma CVD method according to claim 3 wherein a ratio of said Ti-based gas in said first plasma CVD process to said Ti-based gas in said second plasma CVD process is 1/10 to 5/10.

12. A plasma CVD method according to claim 11 wherein a ratio of said nitrogen-based gas is fixed in both said first and second plasma CVD processes.

13. A plasma CVD method according to claim 11 wherein a ratio of said $H_2$ gas in said first plasma CVD process to said $H_2$ gas in said second plasma CVD process is 3/13 to 7/13.

14. An optical plasma CVD method for depositing TiN layers on a processed substrate by using mixture gas comprising Ti-based gas, $H_2$ gas and nitrogen-based gas, said optical plasma CVD method wherein a first optical plasma CVD process radiating an exciting light beam and having a low mixture ratio of said Ti-based gas in said mixture gas is carried out prior to a second optical plasma CVD process radiating an exciting light beam and having an increased mixture ratio of said Ti-based gas in said mixture gas.

15. An optical plasma CVD method for depositing TiN layers on a processed substrate by using mixture gas comprising Ti-based gas, $H_2$ gas and nitrogen-based gas, said optical plasma CVD method wherein a first optical plasma CVD process radiating an exciting light beam and having a high mixture ratio of said $H_2$ in said mixture gas is carried out prior to a second optical plasma CVD process radiating an exciting light beam and having a decreased mixture ratio of said $H_2$ in said mixture gas.

16. An optical plasma CVD method for depositing TiN layers on a processed substrate by using mixture gas comprising Ti-based gas, $H_2$ gas and nitrogen-based gas, said optical plasma CVD method wherein a first optical plasma CVD process radiating an exciting light beam and having low mixture ratios of said Ti-based gas and said $H_2$ gas in said mixture gas is carried out prior to a second optical plasma CVD process radiating an exciting light beam and having increased mixture ratios of said Ti-based gas and said $H_2$ gas in said mixture gas.

17. An optical plasma CVD method according to claim 14, 15 or 16 where said Ti-based gas is either halogen titanium or an organic titanium compound.

18. An optical plasma CVD method according to claim 14, 15 or 16 wherein said nitrogen-based gas is either $N_2$, $NH_3$ or $N_2H_4$.

19. A plasma CVD method for depositing TiN layers on a processed substrate using a mixture of gases, said plasma CVD method comprising the steps of:

performing a first plasma CVD process wherein said mixture of gases comprise Ti-based gas, $H_2$ gas, and nitrogen-based gas, wherein said Ti-based gas is present at a first mixture ratio of Ti-based gas to the remaining gases, and wherein said nitrogen based gas is present at a second mixture ratio of nitrogen based gas to the remaining gases; and performing a second plasma CVD process wherein said mixture of gases comprise Ti-based gas, $H_2$ gas, and nitrogen-based gas, wherein said Ti-based gas is present at a third mixture ratio of Ti-based gas to the remaining gases, said third mixture ratio being higher than said first ratio, and wherein said nitrogen based gas remains present at said second mixture ratio.

20. A plasma CVD method for depositing TiN layers on a processed substrate using a mixture of gases, said plasma CVD method comprising the steps of:

performing a first plasma CVD process wherein said mixture of gases comprise Ti-based gas, $H_2$ gas, and nitrogen-based gas, wherein said $H_2$ gas is present at a first mixture ratio of $H_2$ gas to the remaining gases, and wherein said nitrogen based gas is present at a second mixture ratio of nitrogen based gas to the remaining gases; and performing a second plasma CVD process wherein said mixture of gases comprise Ti-based gas, $H_2$ gas, and nitrogen-based gas, wherein said $H_2$ gas is present at a third mixture ratio of $H_2$ gas to the remaining gases, said third mixture ratio being lower than said first ratio, and wherein said nitrogen based gas remains present at said second mixture ratio.

21. A plasma CVD method for depositing TiN layers on a processed substrate using a mixture of gases, said plasma CVD method comprising the steps of:

performing a first plasma CVD process wherein said mixture of gases comprise Ti-based gas, $H_2$ gas, and nitrogen-based gas, wherein said $H_2$ gas and Ti-based gas are present at a first mixture ratio of $H_2$ gas to Ti-based gas, and wherein said nitrogen based gas is present at a second mixture ratio of nitrogen based gas to the remaining gases; and performing a second plasma CVD process wherein said mixture of gases comprise Ti-based gas, $H_2$ gas, and nitrogen-based gas, wherein said $H_2$ gas and Ti-based gas are present at a third mixture ratio of $H_2$ gas to Ti-based gas, said third mixture ratio being lower than said first ratio, and wherein said nitrogen based gas remains present at said second mixture ratio.

* * * * *